United States Patent [19]

Nishi et al.

[11] Patent Number: 4,727,341

[45] Date of Patent: Feb. 23, 1988

[54] OPTICAL MODULATOR

[75] Inventors: Kenichi Nishi; Hiroyoshi Rangu, both of Tokyo, Japan

[73] Assignee: NEC Corporation, Tokyo, Japan

[21] Appl. No.: 878,741

[22] Filed: Jun. 26, 1986

[30] Foreign Application Priority Data

Jun. 28, 1985 [JP] Japan .................. 60-141727
Jun. 28, 1985 [JP] Japan .................. 60-141730

[51] Int. Cl.$^4$ ............................... H01S 3/00
[52] U.S. Cl. ..................... 332/7.51; 357/16
[58] Field of Search ............ 357/16, 17; 332/7.51; 372/43

[56] References Cited

U.S. PATENT DOCUMENTS

| | | | |
|---|---|---|---|
| 4,414,558 | 11/1983 | Nishizawa et al. | 357/16 X |
| 4,476,477 | 10/1984 | Capasso et al. | 357/16 X |
| 4,525,687 | 6/1985 | Chemla et al. | 332/7.51 |
| 4,546,479 | 10/1985 | Ishikawa et al. | 357/17 X |
| 4,568,959 | 2/1986 | Chang et al. | 357/16 X |
| 4,599,632 | 7/1986 | Bethea et al. | 357/16 X |
| 4,599,728 | 7/1986 | Alavi et al. | 357/16 X |
| 4,607,272 | 8/1986 | Osbourn | 357/16 X |
| 4,616,244 | 10/1986 | Yamazaki | 357/17 |
| 4,620,214 | 10/1986 | Margalit et al. | 307/16 X |

OTHER PUBLICATIONS

Wood et al, "High-Speed Optical Modulation with GAAS/GaAlAs Guantum Wells in a Pin Diode Structure", Appl. Phys. Lett., vol. 44. No. 1, 1984.
Bastard et al, "Variational Calculations on a Guantum Well in an Electric Field", Phys. Rev. B, vol. 28, p. 3241, 1983.

Primary Examiner—Thomas H. Tarcza
Assistant Examiner—Mark Hellner
Attorney, Agent, or Firm—Sughrue, Mion, Zinn, Macpeak, and Seas

[57] ABSTRACT

An optical modulator for varying intensity, frequency, phase and other information associated with input light in response to a voltage which is applied thereto from outside is disclosed. The modulator comprises a semiconductor substrate, at least one semiconductor ultrathin layer which is thinner than an order of electron mean free path, and electrodes capable of applying an electric field to said ultrathin layer in a perpendicular direction to the layers. The band gap of narrow band gap layers in the ultrathin layer is spatially varied with respect to the perpendicular direction to the layers. The band gap of the narrow band gap layers is monotonously varied in the perpendicular direction to the layers. The ultrathin layer is interposed between a p-type semiconductor and an n-type semiconductor with respect to the perpendicular direction to the layers, a band gap of semiconductor layers in the ultrathin layer and having a narrow band gap being sequentially narrowed toward the p-type semiconductor layer. The band gap of semiconductor layers in the ultrathin layer and having a narrow band gap is largest in the vicinity of the center and sequentially reduced toward opposite ends.

9 Claims, 12 Drawing Figures

OPTICAL MODULATOR

BACKGROUND OF THE INVENTION

The present invention relates to an optical modulator for varying intensity, frequency, phase and other information on input light in response to voltages which are applied thereto from the outside.

A semiconductor laser is extensively used as a light source for an optical communication system and others. Methods of varying the light output intensity, phase and frequency of a semiconductor laser at high speed known in the art may generally be classified into two types, i.e., a method which directly varies an injection current adapted to drive a laser and a method which modulates a light beam issuing from a light source by passing it through an optical modulator. The current modulation type method is free from insertion loss due to an optical modulator because it does not rely on an optical modulator. However, the problems with such a method are that during high-speed modulation above several hundreds of megahertz it is difficult to detect a signal beam due to distortions of a modulated wave, which are caused by relaxation oscillation of carriers in the laser, and chirp of lasing wavelength, and that direct modulation above about 4 gigabits per second is almost impractical because the modulation rate is limited by carrier lifetime. Meanwhile, the beam modulation type method which uses an optical modulator can perform high-speed modulation on the order of 10 gigabits per second and allows a minimum of chirp to occur even during high-speed modulation. Nevertheless, where use is made of an ordinary optical modulator, the beam modulation type method brings about significant insertion loss and, therefore, cannot be advantageously applied to communications, especially long-distance communications. In addition, a high on/off ratio is unattainable unless the optical modulator is driven by high voltages.

In relation to the beam modulation type scheme, there has been proposed an optical modulator which, implemented with a multi-layer semiconductor, is small in loss and capable of performing high-speed modulation. An example of such a kind of optical modulators is disclosed in T. H. Wood et al. "High-speed optical modulation with GaAs/GaAlAs quantum wells in a p-i-n diode structure", Appl. Phys. Lett., Vol. 44, No. 1, pp. 16–18, 1984. In this example, an electric field is applied to ultrathin semiconductor layers so that due to the resultant quantum confined startk effect the absorption edge is shifted toward longer wavelengths. An effort is made in this example to achieve a high on/off ratio taking advantage of the shift, as is caused by that of the absorption edge, of a sharp absorption peak due to exciton which exists even at room temperature by virtue of quantum size effects. However, the effect attainable with such a scheme is limited because in an ultrathin layer structure heretofore contemplated the energy value of a conduction band or valence band is spatially constant and, therefore, any change in the band structure caused by an externally derived electric field entails a decrease in the overlap integral of a wave function representative of a probability of existence of electrons in the conduction band and a one representative of a probability of existence of holes in the valence band, while entailing a decrease in the absorption coefficient itself.

SUMMARY OF THE INVENTION

It is therefore an object of the present invention to provide an optical modulator which is capable of modulation up to high frequencies and accomplishes a high on/off ratio despite low drive voltages.

It is another object of the present invention to provide a generally improved optical modulator.

In accordance with the present invention, there is provided an optical modulator comprising a semiconductor substrate, at least one semiconductor ultrathin layer which is thinner than an order of electron mean free path, and electrodes capable of applying an electric field to the ultrathin layer in a perpendicular direction to the layers, a band gap of narrow band gap layers in the ultrathin layer being spatially varied with respect to the perpendicular direction to the layers.

According to a specific feature of the invention, the band gap of the narrow band gap layers is monotonously varied in the perpendicular direction to the layers. The ultrathin layer may be interposed between a p-type semiconductor and an n-type semiconductor with respect to the perpendicular direction to the layers, and a band gap of semiconductor layers in the ultrathin layer and having a narrow band gap may be sequentially narrowed toward the p-type semiconductor layer, for further enhancing the effects.

According to another feature of the invention, a band gap of semiconductor layers in the ultrathin layer and having a narrow band gap is largest in the vicinity of a center and sequentially reduced toward opposite ends.

The above and other objects, features and advantages of the present invention will become more apparent from the following detailed description taken with the accompanying drawings.

DESCRIPTION OF THE PREFERRED EMBODIMENTS

Figure 1:
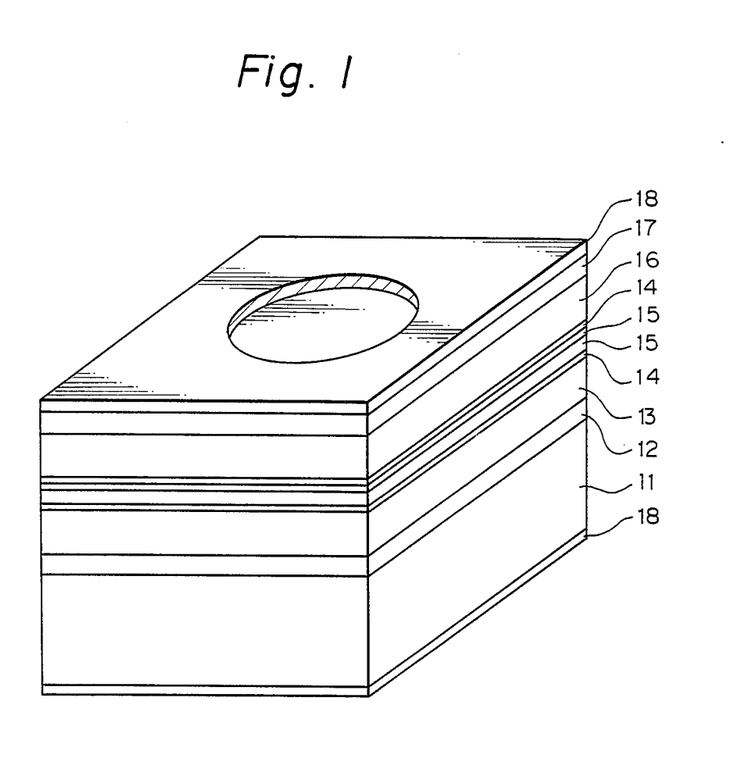
FIG. 1 is a perspective view of an optical modulator in accordance with a first embodiment of the present invention.
Figure 2:
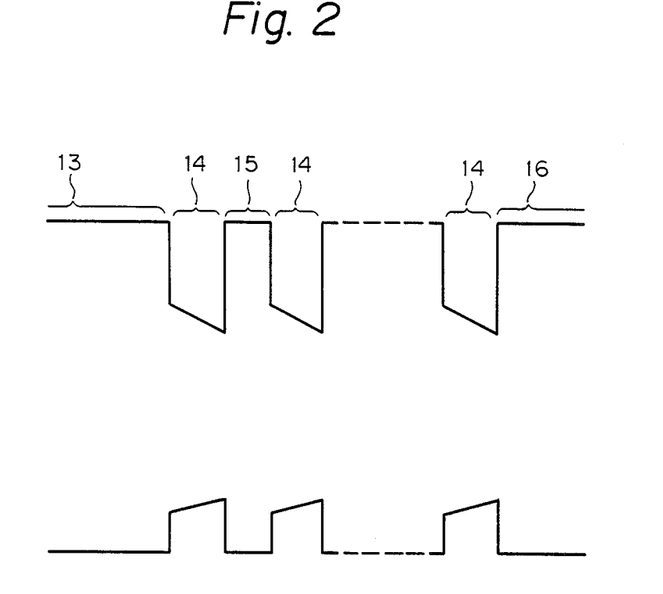
FIG. 2 is a band diagram associated with a semiconductor ultrathin layer of the optical modulator.
Figure 3:
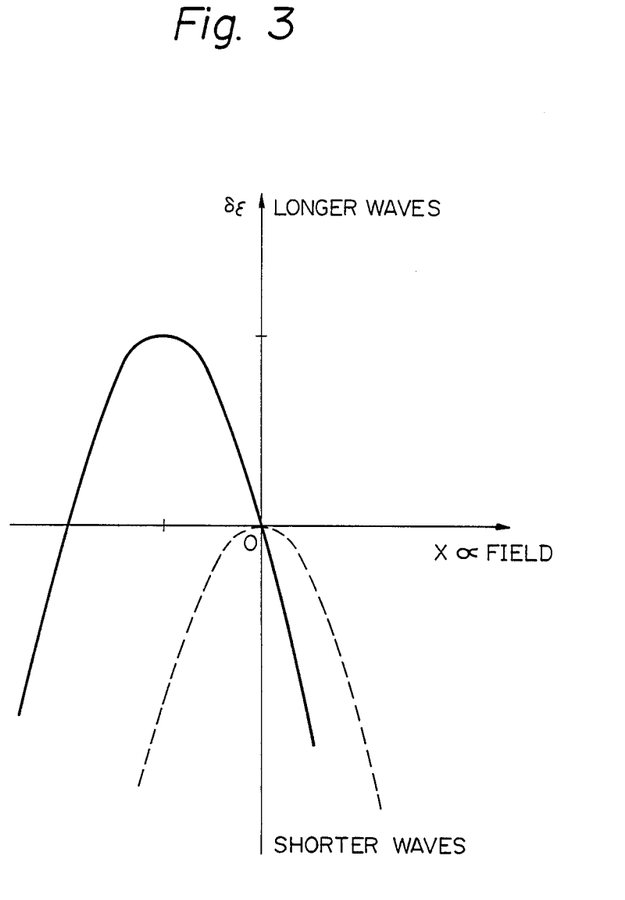
FIG. 3 is a graph showing amounts of deformation of a band structure of quantum well layers and those of shift of an absorption edge caused by an electric field.

Referring to FIGS. 1 to 3, a first embodiment of the optical modulator in accordance with the present invention is shown. As shown, a semiconductor ultrathin layer consists of a narrow band gap layer 14 (hereinafter referred to as a quantum well layer) and a wide band gap layer 15 (hereinafter referred to as a barrier layer). The wavelength of an incident beam is selected to be slightly longer than the absorption edge of the ultrathin layer. A beam incident to the optical modulator is passed through a bore which is formed by removing those layers which are adapted for electrodes 18 and narrow band-gap ohmic contact layer 17. The band gap of the quantum well layer 14 is substantially linearly varied in the perpendicular direction to the layers by changing the alloy composition of the semiconductor.

Theoretically, it was proved that where a rectangular quantum well potential is so deformed as to become inclined at the band edge by an electric field which is applied in the perpendicular direction to the layers, the energy levels at which electrons and holes and other carriers can exist are lowered compared to those under zero-field (Bustard et al, Phys. Rev. B, Vol. 28, p. 3241, 1983). Applying this theory to this particular embodiment of the present invention, electric field dependence of the absorption edge is calculated as represented by a graph in FIG. 3.

In FIG. 3, there is shown a relationship between an amount of deformation x of the band structure of the quantum well layers 14 caused by an electric field and an amount of variation $\delta\epsilon$ of the absorption edge, a solid curve representing the illustrative embodiment and a dash-dotted curve a case with prior art rectangular quantum wells. The amount of variation of the absorption edge due to an electric field which is applied to the quantum well layers by actually applying a voltage in the perpendicular direction to the layers will be discussed with reference to FIG. 3. When the electric field is zero, the deformation x is zero. In this particular embodiment, as an electric field is increased from zero in a direction for increasing the minimum energy value at the lower end of the conduction band in quantum wells (hereinafter referred to as a positive direction), the absorption edge shifts toward longer wavelengths; as it is applied in the other or negative direction, the absorption edge shifts toward shorter wavelengths. Moreover, in this case, a considerably large amount of variation of the absorption edge is ensured even if the same electric field as the prior art one is applied to vary the value of x by the same amount. Further, unless an electric field intense enough to make the lower edge or the upper end of the conduction band in the quantum wells horizontal is applied, the wave function of electrons and that of holes are prevented from locally existing in the hetero interface of the opposite direction and, hence, the variation of the overlap integral is insignificant. Therefore, even if the absorption edge is varied, the reduction ratio of the absorption coefficient is negligibly small.

Furthermore, where the quantum well layer is interposed between a p-type cladding layer 16 and an n-type cladding layer 13 and, in addition, the p-type layer 16 is located in a position where the band gap is reduced, an intrinsic electric field corresponding to a condition wherein x of FIG. 3 is positive is considered to exist by virtue of a so-called built-in effect derived from a p-n junction even if an externally derived electric field is absent. It will be seen that applying an electric field from the outside in the presence of the intrinsic one makes it possible to cause the absorption edge to undergo a far greater amount of variation responsive to the electric field applied.

In this particular embodiment, the quantum well layer 14 comprises a non-doped $AlXGa_{1-x}As$ layer whose Al concentration x is varied continuously and substantially linearly from 0.15 to 0 in the perpendicular direction to the layers, the barrier layer 15 a non-doped n-$Al_{0.4}Ga_{0.6}As$ layer, the n-type cladding layer 13 a Si-doped n-$Al_{0.4}Ga_{0.6}As$ layer, and the p-type cladding layer 16 a Be-doped p-$Al_{0.4}Ga_{0.6}As$ layer.

A method of manufacturing the above structure will be outlined hereinafter.

The method uses molecular beam epitaxy (MBE). The procedure starts with depositing on a Si-doped n-GaAs substrate 11 a 1.0 microns thick Si-doped n-GaAs buffer layer 12 and the Si-doped n-$Al_{0.4}Ga_{0.6}As$ cladding layer 23 which is 2.0 microns thick. Then, the non-doped $Al_xGa_{1-x}As$ quantum well layer 14 which is 100 angstroms thick and has an Al concentration x varying from 0.15 to 0 and the non-doped $Al_{0.4}Ga_{0.6}As$ barrier layer 15 which is 80 angstroms thick are alternately laminated thirty periods. This is followed by growing the Be-doped p-$Al_{0.4}Ga_{0.6}As$ cladding layer 16 which is 2.0 microns thick, and a Be-doped p-GaAs contact layer 17 which is 0.5 microns thick. The resultant wafer is trimmed to form a chip having a size of the order of $5\times 5$ millimeters, then the GaAs layers at the top and bottom of the chip are removed circularly by selective etching, and then electrodes are provided on the remaining GaAs layers.

Figure 4A:
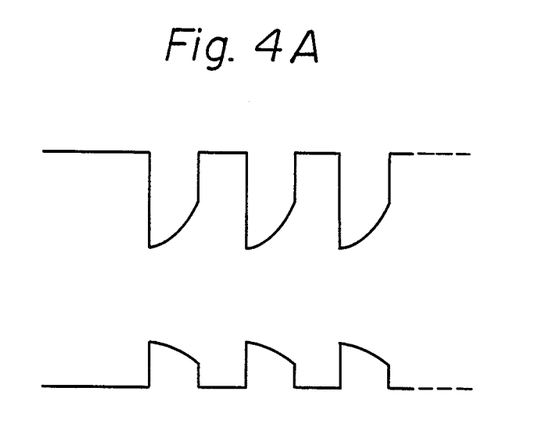
FIGS. 4A and 4B are band diagrams representative of other examples of the band structure in accordance with the first embodiment.
Figure 4B:
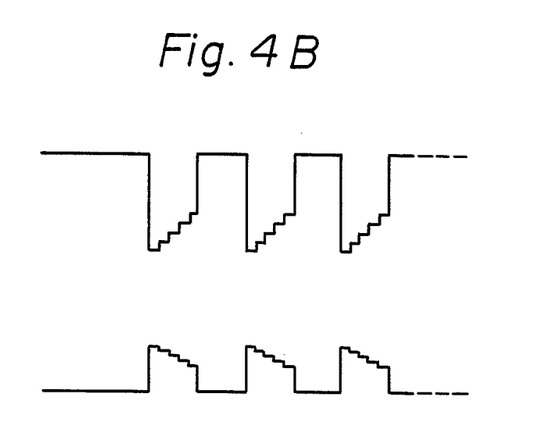

The crux of this particular embodiment is that the band gap in the quantum well layers is monotonously varied in the perpendicular direction to the layers, preferably sequentially narrowed toward the p-type semiconductor layer. Hence, the manner of variation of the band gap in the quantum wells, the materials, the method of semiconductor growth and others do not constitute any essential part of this embodiment. Whether the band gap may be not spatially linear but curved as shown in FIG. 4A or varied stepwisely as shown in FIG. 4B, the effects obtainable remain essentially the same.

Figure 5:
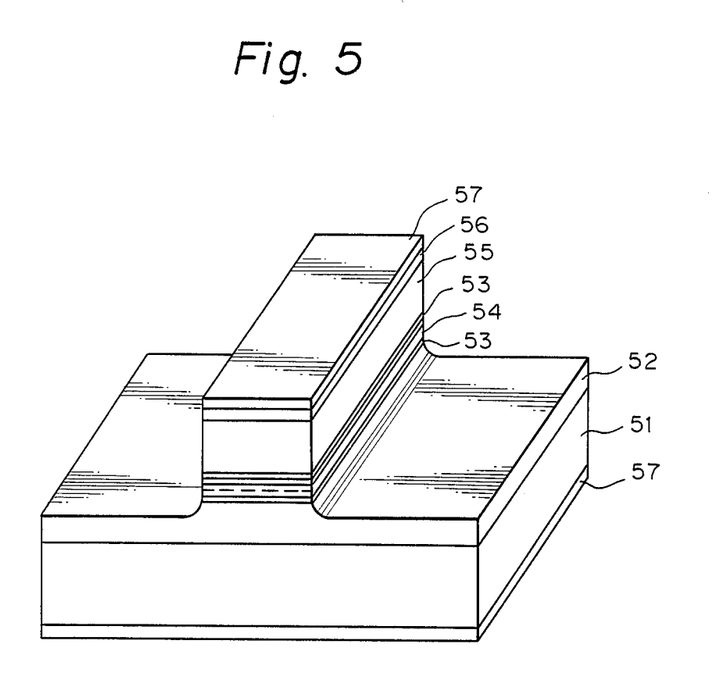
FIG. 5 is a perspective view of a second embodiment of the present invention.

Referring to FIG. 5, a second embodiment of the present invention is shown in a perspective view. The optical modulator of FIG. 5 has a waveguide type structure. A light beam is incident to the modulator parallel to the laminated surfaces and guided by a path defined by a semiconductor ultrathin layer portion and semiconductor layers above and below the ultrathin layer portion. When a light beam is incident to the waveguide structure, the voltage dependence of the transmission spectra is measured at the absorption edge to be substantially 1295 nanometers, 1305 nanometers and 1314 nanometers for voltages of +1 volt, 0 volt and −1 volt, respectively. Where the waveguide length is 200 microns and a laser beam whose wavelength is 1300 nanometers is incident to the modulator and the above-mentioned voltage is applied to the modulator, a beam coming out of the modulator has an intensity which is about 1% of the incoming laser beam for the voltage of +1 volt and about 70% of the same for the voltage of −1 volt. In this case, the on/off ratio is substantially 18 dB, which is an excellent value. When the intensity of light is modulated by the modulation of the voltage applied, the maximum frequency which can be modulated is substantially 3 gigahertz and, moreover, this is determined by a parasitic capacitance between the electrodes.

A method of manufacturing the optical modulator of FIG. 5 will be briefly described.

A 2.0 microns thick S-doped n-InP buffer layer 52 is deposited on an S-doped n-InP substrate 51 by vapor phase epitaxy. Then, a 120 angstroms thick non-doped $In_{0.75}Ga_{0.25}As_xP_{1-x}$ quantum well layer 53 and a non-doped InP barrier layer 54 are alternately formed six periods, the quantum well layer 53 having an As concentration x which varies continuously from 0.50 to 0.60. Sequentially formed on the resultant laminate are a 2.5 microns thick Zn-doped p-InP cladding layer 55, and a 0.5 microns thick Zn-doped p-InGaAsP contact layer 56. Electrodes 57 are deposited on opposite surfaces of such a wafer and, then, a $SiO_2$ film is deposited on the top of the resultant laminate by a CVD method which is well known in the art. In this condition, the $SiO_2$ film is removed except for a 1.5 microns wide stripe region by ordinary photolithography and, subsequently, those portions where the $SiO_2$ is absent are removed by chemical etching down to the depth of the n-InP buffer layer 52. Finally, the remaining $SiO_2$ is removed to complete a waveguide structure.

Figure 6:
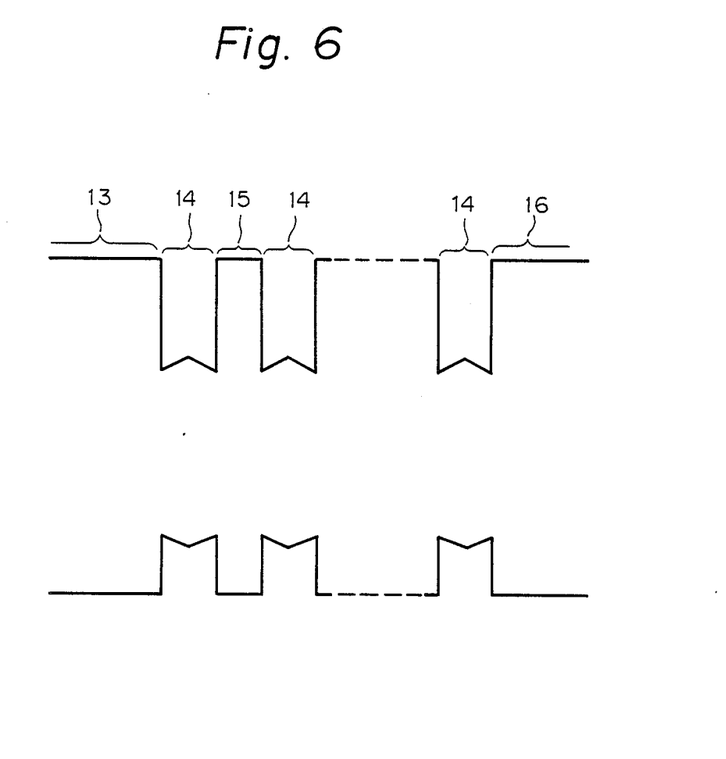
FIG. 6 is a band diagram associated with a semiconductor ultrathin layer portion of an optical modulator in accordance with a third embodiment of the present invention.

Referring to FIG. 6, there is shown a band diagram associated with a semiconductor ultrathin layer portion of an optical modulator in accordance with a third embodiment of the present invention. This embodiment adopts the same laminate structure and structure of electrodes and others as those of the previously described first embodiment except for the manner of variation of the composition in the quantum well layers 14 which is to vary the band structure of the layers 14. Specifically, the band gap of each quantum well layer 14 is varied due to variation of the composition such that it assumes the largest value substantially at the center and sequentially decreases toward opposite ends with respect to the perpendicular direction to the layers. A variation of the band structure of the quantum well layers 14 due to an electric field which is applied in the perpendicular direction to the layers and that of the absorption spectrum of the band structure are shown in FIGS. 7A and 7B.

Figure 7A:
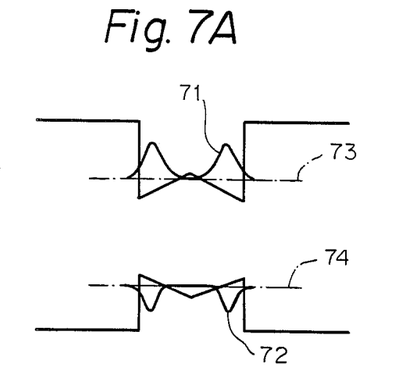
FIG. 7A is a band diagram representative of quantum well layers of the third embodiment under zero-field.
Figure 7B:
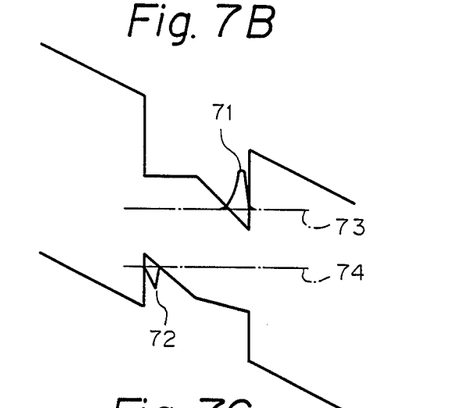
FIG. 7B is a band diagram representative of a condition wherein an electric field is applied in a laminating direction.
Figure 7C:
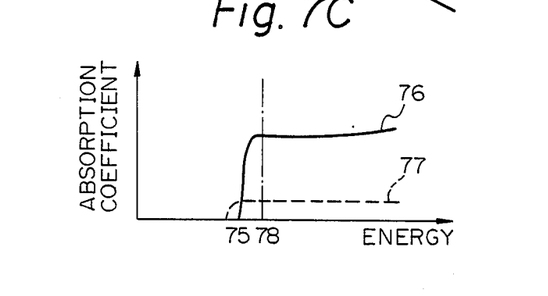
FIG. 7C is a graph showing dependence of absorption coefficient spectra on an electric field in accordance with the third embodiment.

Specifically, FIG. 7A is representative of a case wherein an electric field is not applied to the band structure of the semiconductor ultrathin layer portion, and FIG. 7B a case wherein an electric field is applied in the perpendicular direction to the layers. Deformation of a wave function 71 of electrons and that of a wave function 72 of holes each being caused by an electric field will be analyzed referencing FIGS. 7A and 7B. Under the zero-field as shown in FIG. 7A, both of the wave functions 71 and 72 are positioned in the vicinity of opposite hetero interfaces in the narrow band gap layer, or quantum well layer, and each has a substantially symmetrical configuration. Hence, the overlap integral of the wave functions 71 and 72 is substantially 1. Under the applied field as shown in FIG. 7B, on the other hand, the band structure is deformed with the result that in accordance with the present invention the wave function 71 is noticeably localized to the vicinity of one hetero interface and the wave function 72 to the vicinity of the other hetero structure; because the wave functions 71 and 72 overlap each other only in an exponentially decreasing region, the overlap integral is close to 0. The overlap integral is substantially proportional to the absorption coefficient and, further, the energy 75 (FIG. 7C) at the absorption edge which is determined by a difference between the energy level 73 of electrons and that 74 of holes is decreased upon application of an electric field. For these reasons, the absorption coefficient spectrum varies as shown in FIG. 7C in response to an electric field. In FIG. 7C, a solid curve 76 is representative of an absorption coefficient spectra under the zero-field, and a dash-dotted curve 77 an absorption coefficient spectra under the field. It will therefore be seen that concerning a beam having energy 78 which is slightly greater than the absorption edge under the zero-field it is greatly absorbed by the quantum well layer under the zero-field because, in such a condition, the absorption coefficient is large, but under the applied field it is hardly absorbed because the absorption coefficient in such a condition is close to zero. This teaches that the intensity of a beam having the energy 78 can be modulated with a high on/off ratio by turning on and off the application of an electric field.

Processes for manufacturing the optical modulator in accordance with the third embodiment as discussed above will be outlined.

The optical modulator of this embodiment is manufactured by the MBE technology. The procedure begins with depositing on a Si-doped n-GaAs substrate 11 a 1.0 microns thick Si-doped n-GaAs buffer layer 12 and a 2.0 microns thick Si-doped n-$Al_{0.4}Ga_{0.6}As$ cladding layer 13. Then, a 100 angstroms thick non-doped $Al_x$-$Ga_{1-x}As$ quantum well layer 14 with an Al concentration x thereof continuously increased from 0 to 0.15 and then continuously decreased back to 0 and an 80 angstroms thick non-doped $Al_{0.4}Ga_{0.6}As$ barrier layer 15 are alternately laminated 30 periods to form a thin layer structure. Grown on this structure are a 2.0 microns thick Be-doped p-$Al_{0.4}Ga_{0.6}As$ cladding layer 16 and a 0.5 microns thick Be-doped GaAs contact layer 17. The resultant wafer is trimmed to provide a tip having a size of the order of $5 \times 5$ millimeters, then electrodes 18 are formed on the top and bottom of the tip, and then the tip is selectively removed in a circular form by chemical etching down to the depth of the upper and lower GaAs layers.

Figure 8A:
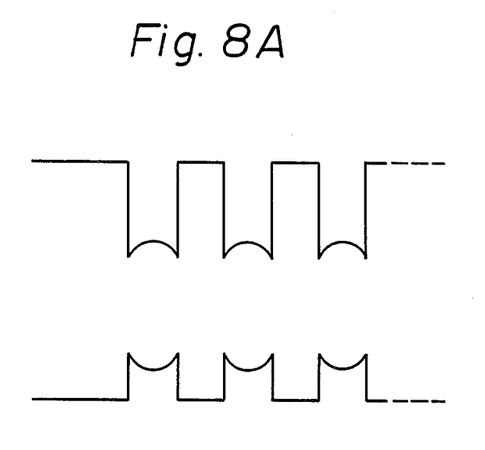
FIGS. 8A and 8B are band diagrams representative of other specific band structures in accordance with the third embodiment.
Figure 8B:
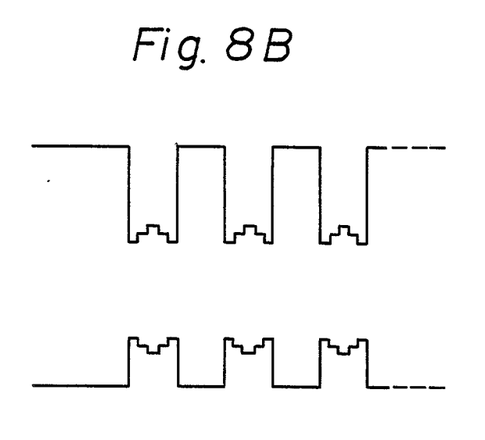

A characteristic feature of this particular embodiment is that the band gap of the quantum well layers is broadened at the beginning and then narrowed midway. So long as such a feature is preserved, this embodiment is not limited by any of the manner of variation, the position of a peak of the variation, materials, the method of growth, etc. Especially, even if the band gap is varied spatially along a curve of secondary degree as shown in FIG. 8A or stepwisely as shown in FIG. 8B, the essential effects remain the same.

Various modifications will become possible for those skilled in the art after receiving the teachings of the present disclosure without departing from the scope thereof.

What is claimed is:

1. An optical modulator for varying intensity, frequency, phase and polarization associated with input light in response to a voltage which is applied thereto from outside, comprising:
   a semiconductor substrate;
   a plurality of semiconductor layers, including at least one semiconductor ultrathin layer, said ultrathin layer including a plurality of alternating narrow band gap layers and wide band gap layers, each of said narrow band gap layers having a narrow band gap which is thinner than an order of electron mean free path; and electrodes for applying an electric field to said ultrathin layer in a perpendicular direction to the semiconductor layers, said narrow band gap of each of said narrow band gap layers being spatially varied within each of said narrow band gap layers with respect to the perpendicular direction to the semiconductor layers.

2. An optical modulator as claimed in claim 1, wherein the band gap of said narrow band gap layer is monotonously varied in the perpendicular direction to the semiconductor layers.

3. An optical modulator as claimed in claim 2, wherein said ultrathin layer is interposed between a p-type semiconductor and an n-type semiconductor with respect to the perpendicular direction to the semiconductor layers, said narrow band gap being sequentially narrowed toward said p-type semiconductor layer.

4. An optical modulator as claimed in claim 1, wherein said narrow band gap is largest in the vicinity of a center of said ultrathin layer with respect to the perpendicular direction of said semiconductor layers and sequentially reduced toward opposite ends of said ultrathin layer with respect to the perpendicular direction of said semiconductor layers.

5. An optical modulator as claimed in claim 1, 2, 3 or 4, wherein said ultrathin layer is interposed between a p-type semiconductor and an n-type semiconductor with respect to the perpendicular direction to the layers, each of said p- and n-type semiconductors being provided with an ohmic contact, for applying an electric field to said ultrathin layer in response to a voltage which is applied across said electrodes.

6. An optical modulator as claimed in claim 1, 2, or 4, wherein one surface of a laminate of said semiconductor layers which is close to said ultrathin layer is provided with a Schottky electrode, and the other surface is provided with an ohmic electrode, a voltage being applied to said Schottky electrode to apply an electric field to said ultrathin layer in the perpendicular direction to the layers.

7. An optical modulator as claimed in claim 1, 2, 3, or 4 wherein said ultrathin layer and said semiconductors layers disposed above and below said ultrathin layer constitute a waveguide structure, the input light being incident parallel to laminated surfaces and modulated while being guided by said waveguide structure.

8. An optical modulator as claimed in claim 5 wherein said ultrathin layer and said semiconductor layers disposed above and below said ultrathin layer constitute a waveguide structure, the input light being incident parallel to laminated surfaces and modulated while being guided by said waveguide structure.

9. An optical modulator as claimed in claim 6, wherein said ultrathin layer and said semiconductor layers disposed above and below said ultrathin layer constitute a waveguide structure, the input light being incident parallel to laminated surfaces and modulated while being guided by said waveguide structure.

* * * * *